United States Patent
Kim et al.

(10) Patent No.: US 9,520,829 B1
(45) Date of Patent: Dec. 13, 2016

(54) APPARATUS AND METHOD OF FINE CAPACITANCE TUNING FOR HIGH RESOLUTION DIGITALLY CONTROLLED OSCILLATOR

(71) Applicant: Samsung Electronics Co., Ltd., Gyeonggi-do (KR)

(72) Inventors: Sunghwan Kim, Los Gatos, CA (US); Wing Fai Loke, San Jose, CA (US); Siddharth Seth, San Jose, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/964,243

(22) Filed: Dec. 9, 2015

Related U.S. Application Data (60) Provisional application No. 62/220,477, filed on Sep. 18, 2015.

(51) Int. Cl.
*H03B 5/12* (2006.01)
*H01G 15/00* (2013.01)

(52) U.S. Cl.
CPC ............ *H03B 5/1293* (2013.01); *H01G 15/00* (2013.01)

(58) Field of Classification Search
USPC .............................................. 331/177 V, 36 C
See application file for complete search history.

(56) References Cited

U.S. PATENT DOCUMENTS

| | | |
|---|---|---|
| 6,658,748 B1 | 12/2003 | Leipold et al. |
| 7,212,073 B2 | 5/2007 | Youssoufia et al. |
| 7,474,167 B1 | 1/2009 | Zhuang et al. |
| 8,198,944 B2 | 6/2012 | Sun et al. |
| 8,222,962 B2 | 7/2012 | Lin et al. |
| 8,912,854 B2 * | 12/2014 | Ainspan ............... H03B 5/1206 331/117 FE |
| 2009/0302958 A1 | 12/2009 | Sakurai et al. |
| 2010/0052795 A1 | 3/2010 | Nakamura et al. |
| 2010/0134195 A1 | 6/2010 | Lee et al. |
| 2014/0167871 A1 | 6/2014 | Ahmed et al. |
| 2014/0184363 A1 | 7/2014 | Jou et al. |
| 2014/0347137 A1 | 11/2014 | Rey et al. |

FOREIGN PATENT DOCUMENTS

WO  WO 2014006439  1/2014

* cited by examiner

*Primary Examiner* — Joseph Chang
(74) *Attorney, Agent, or Firm* — The Farrell Law Firm, P.C.

(57) ABSTRACT

An apparatus and a method are provided. The apparatus includes a first capacitor, including a first end and a second end; a second capacitor, including a first end connected to the second end of the first capacitor, and a second end; a variable capacitor, including a first end connected to the second end of the first capacitor, and a second end; a third capacitor, including a first end connected to the first end of the first capacitor, and a second end connected to the second end of the variable capacitor; and a fourth capacitor, including a first end connected to the second end of the third capacitor, and a second end connected to the second end of the second capacitor.

20 Claims, 6 Drawing Sheets

APPARATUS AND METHOD OF FINE CAPACITANCE TUNING FOR HIGH RESOLUTION DIGITALLY CONTROLLED OSCILLATOR

PRIORITY

This application claims priority under 35 U.S.C. §119(e) to a U.S. Provisional Patent Application filed on Sep. 18, 2015 in the United States Patent and Trademark Office and assigned Ser. No. 62/220,477, the entire contents of which are incorporated herein by reference.

BACKGROUND OF THE DISCLOSURE

1. Field of the Disclosure

The present disclosure relates generally to an apparatus for and a method of fine capacitance tuning, and more particularly, to an apparatus for and a method of fine capacitance tuning for a high resolution digitally controlled oscillator.

2. Description of the Related Art

The frequency output of a digitally controlled oscillator (DCO) is determined by an inductor-capacitor tank circuit. Variable capacitive elements are used to control the frequency. Frequency tuning typically involves coarse tuning capacitors and fine tuning capacitors, where coarse tuning capacitors are used to mitigate process, voltage, and temperature (PVT) variations, and where fine tuning capacitors are used to generate an accurate frequency, where dithering may be used for fine tuning.

In all-digital phase-locked loops (ADPLLs), quantization noise introduced by frequency discretization in a DCO can affect performance in terms of out-of-band phase noise. In particular, quantization noise must be much lower than intrinsic oscillator phase noise.

Very fine frequency resolution is one method of reducing quantization noise. In addition, target frequency resolution for a wireless application is so small that it is challenging to transform a varactor-based voltage controlled oscillator (VCO) to a DCO. For example, in the design of a DCO for global system for mobile communications (GSM) applications, the target frequency resolution of a few kilohertz (KHz) with respect to a tuning range of several hundred megahertz (MHz) around the carrier (e.g., 900/1800 MHz in GSM) results in capacitive elements of the order of atto-Farads, which may not be easily integrated. Thus, fine frequency steps in the range of 10 KHz are required to reduce quantization noise.

In addition, switch parasitic and PVT variation is typically larger than the required fine frequency (e.g. capacitance) steps.

Furthermore, if a parasitic capacitance at an output of a DCO is larger than a capacitance step then the frequency tuning range of the DCO is reduced.

In the related art, converting analog control of a varactor to digital control involves additional digital circuitry.

Implementing a metal-insulator-metal (MIM) capacitor or a variable capacitor in atto-Farads is either impossible or impractical due to dimension limits on capacitors in a manufacturing process.

Connecting capacitors in series to reduce capacitance step size typically involves a large fixed capacitor at the output.

A capacitive network is used to change the step size. The effective capacitance of the capacitive network is changed by changing the capacitance of a capacitor within the capacitive network. The amount by which the effective capacitance changes due to a change in the capacitance of a capacitor within the capacitive network is commonly referred to as a shrink factor. The shrink factor determines the minimum step size of the capacitive network. Thus, the smaller the change in effective capacitance that can be achieved by a change in capacitance of a capacitor within the capacitive network, the higher the frequency resolution of the DCO.

A capacitive network that merely includes capacitors in serial and parallel combinations has an effective capacitance that includes terms that are sums and/or products of the capacitors within the capacitive network, which does not achieve the smallest possible change in effective capacitance, and does not achieve the highest frequency resolution of a DCO.

SUMMARY

An apparatus and a method are provided. The apparatus includes a first capacitor, including a first end and a second end; a second capacitor, including a first end connected to the second end of the first capacitor, and a second end; a variable capacitor, including a first end connected to the second end of the first capacitor, and a second end; a third capacitor, including a first end connected to the first end of the first capacitor, and a second end connected to the second end of the variable capacitor; and a fourth capacitor, including a first end connected to the second end of the third capacitor, and a second end connected to the second end of the second capacitor.

A method is provided. The method includes connecting a first end of a first capacitor to a second end of a second capacitor; connecting a first end of a variable capacitor to the first end of the first capacitor; connecting a first end of a third capacitor to a second end of the first capacitor; connecting a second end of the third capacitor to a second end of the variable capacitor; connecting a first end of a fourth capacitor to the second end of the variable capacitor; and connecting a second end of the fourth capacitor to a second end of the second capacitor.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

There is a need for a capacitive network that provides a change in effective capacitance that is smaller than that which can be achieved by a capacitive network that merely includes capacitors in various serial and parallel combinations.

The present disclosure concerns an apparatus for and a method of fine capacitance tuning for a high resolution DCO (e.g. in the order of kHz) by shrinking the effective capacitance of a variable capacitive element.

Figure 1:
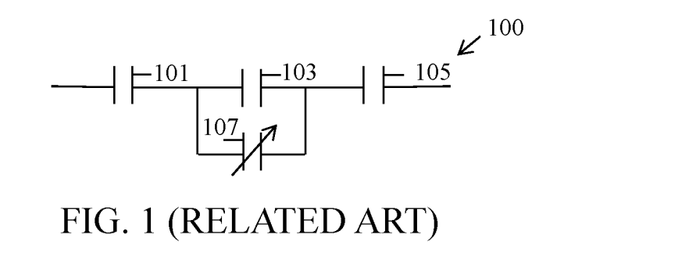
FIG. 1 is a block diagram of a capacitive divider according to the related art.

FIG. 1 is a block diagram of a capacitive divider 100 according to the related art. The capacitive divider 100 scales down a change in capacitance of a variable capacitor 107 (e.g., with capacitance Cx).

Referring to FIG. 1, the capacitive divider 100 includes a first capacitor 101 (e.g., with capacitance Cs), a second capacitor 103 (e.g., with capacitance Cp/2), a third capacitor 105 (e.g., with capacitance Cs), and a variable capacitor 107.

The capacitive divider 100 includes a first end, and a second end. The first capacitor 101 includes a first end and a second end. The second capacitor 103 includes a first end and a second end. The third capacitor 105 includes a first end and a second end. The variable capacitor 107 includes a first end and a second end.

The first end of the first capacitor 101 is a first end of the capacitive divider 100 and the second end of the first capacitor 101 is connected to the first end of the second capacitor 103 and the first end of the variable capacitor 107. The second end of the second capacitor 103 is connected to the second end of the variable capacitor 107 and the first end of the third capacitor 105. The second end of the third capacitor 105 is a second end of the capacitive divider 100. That is, the capacitive divider 100 includes only serial capacitors (i.e., the first capacitor 101 and the third capacitor 105) in series with a parallel combination of capacitors (i.e., the second capacitor 103 and the variable capacitor 107).

The effective capacitance (Ceff) of the capacitive divider 100, as seen between the first end and the second end of the capacitive divider 100, is as in Equation (1) as follows:

$$C_{eff} = \frac{C_s(C_p + 2C_x)}{2(C_s + C_p + 2C_x)} \quad (1)$$

The change in Ceff caused by a change in Cx is as in Equation (2) as follows:

$$\frac{\partial}{\partial C_x} C_{eff} = \left(\frac{C_s}{2C_x + C_p + C_s}\right)^2 \quad (2)$$

Equation (2) includes a sum of capacitance values (i.e., (2Cx+Cp+Cs)), but does not include a difference of capacitors as in the present disclosure.

Cp is increased to decrease $$\frac{\partial}{\partial C_x} C_{eff},$$

in order to reduce the shrinking factor and increase the frequency resolution of a DCO that uses the capacitive divider 100. However, increasing Cp increases the minimum Ceff (i.e., when Cx is minimum) which decreases the frequency tuning bandwidth of the DCO.

Figure 2:
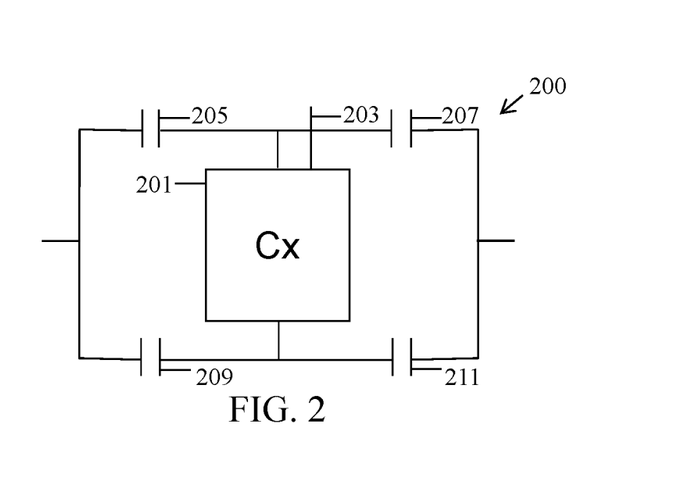
FIG. 2 is a block diagram of a capacitive divider according to an embodiment of the present disclosure.

FIG. 2 is a block diagram of a capacitive divider 200 according to an embodiment of the present disclosure.

Referring to FIG. 2, the capacitive divider 200 includes a variable capacitor 201, a first capacitor 205, a second capacitor 207, a third capacitor 209, and a fourth capacitor 211.

The capacitive divider 200 includes a control input 203, a first end, and a second end. The first capacitor 205 includes a first end and a second end. The second capacitor 207 includes a first end and a second end. The third capacitor 209 includes a first end and a second end. The fourth capacitor 211 includes a first end and a second end.

The first end of the variable capacitor 201 is connected to the first end of the first capacitor 205 and the first end of the second capacitor 207. The second end of the variable capacitor 201 is connected to the first end of the third capacitor 209 and the first end of the fourth capacitor 211. The second end of the first capacitor 205 is connected to the second end of the third capacitor 209 and is a first end of the capacitive divider 200. The second end of the second capacitor 207 is connected to the second end of the fourth capacitor 211 and is a second end of the capacitive divider 200.

In an embodiment of the present disclosure, the first capacitor 205, the second capacitor 207, the third capacitor 209, and the fourth capacitor 211 are fixed capacitors, where the first capacitor 205 and the fourth capacitor 211 have the same, or similar, capacitance value (C1), and where the second capacitor 207 and the third capacitor 209 have the same, or similar, capacitance value (C2).

The differential input impedance of the capacitive divider 200, as seen between the first end and the second end of the capacitive divider 200, is as in Equation (3) as follows:

$$Z_{in} = \frac{1}{j\omega} \frac{2C_x + (C_1 + C_2)}{C_x(C_1 + C_2) + 2C_1C_2} = \frac{1}{j\omega} \frac{2C_x/(C_1 + C_2) + 1}{C_x + 2(C_1 \parallel C_2)} \quad (3)$$

The effective capacitance Ceff of the capacitive divider 200, as seen between the first end and the second end of the capacitive divider 200, is as in Equation (4) as follows:

$$C_{eff} = \frac{C_x(C_1 + C_2) + 2C_1C_2}{2C_x + (C_1 + C_2)} \quad (4)$$

The variation on the capacitive divider 200 is as in Equation (5) as follows:

$$\frac{\partial}{\partial C_x} C_{eff} = \left(\frac{C_1 - C_2}{2C_x + (C_1 + C_2)}\right)^2 \quad (5)$$

As indicated in Equation (5) above, the shrink ratio (Cx vs. Celt) of the capacitive divider 200, which is used for fine capacitive tuning, can be controlled by adjusting C1 and C2. In particular, the shrink factor of the capacitive divider 200 can be controlled by the difference of C1 and C2, whereas the shrink factor of the capacitive divider 100 of FIG. 1 cannot be controlled by a difference of capacitances, as indicated in Equation (2) above.

Cs in the numerator in Equation (2) is limited by the physical implementation of metal-oxide-metal (MOM) capacitor or any transistor capacitors (e.g., a metal oxide semiconductor (MOS) capacitor) in a manufacturing process. In contrast, the numerator in Equation (5) above is not limited by a manufacturing process, because it is determined only by the difference between two physical capacitors. Thus, the shrink factor and Ceff in an embodiment of the present disclosure is less affected by process variations.

To minimize the shrink factor, Cp in Equation (2) above should be large. A larger Cp makes the layout of Cx on an integrated circuit (IC) difficult, due to the necessity of having to route long interconnections, which introduce parasitic capacitance. The capacitive divider 200 enables Cx to be placed in the center of an IC layout, where it is less likely to encounter long routes or interconnections and their associated parasitic capacitance, and enables the fixed capacitors, C1 and C2, to be placed around Cx.

Cx in the capacitive divider 200 may be connected to a node close to a virtual ground, which indicates that a voltage swing across Cx would be much smaller than a voltage swing that would appear at a differential port. This facilitates the use of switched capacitors and core devices, significantly reducing nonlinear (non-ideal) operation of switches.

The variation on the capacitor divider 200 as in Equation (5) above is smaller than that of Equation (2) above when C1 and C2 are as in Equation (6) and Equation (7) as follows:

$$C_1 \leq \frac{1}{2}C_p + C_s \quad (6)$$

$$C_2 \geq \frac{1}{2}C_p \quad (7)$$

The capacitances of MOM and metal oxide semiconductor (MOS) capacitors are sensitive to processes variations. Variations in capacitance cause frequency modulation (FM) noise in a DCO. Since the capacitive divider 200 is less sensitive to process variations, a variation of Ceff of the capacitive divider 200 is smaller as compared to the related art. The stable value of Ceff over process variations enables less frequency perturbations and, hence, less noise.

FIGS. 3A-3D are block diagrams of the variable capacitor 201 of the capacitive divider 200 of FIG. 2 according to embodiments of the present disclosure.

Figure 3A:
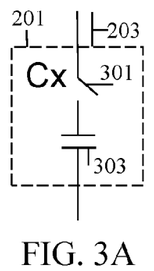
FIGS. 3A-3D are block diagrams of the variable capacitor of the capacitive divider of FIG. 2 according to embodiments of the present disclosure.

Referring to FIG. 3A, the variable capacitor 201 includes a control input 203 for changing the capacitance of the variable capacitor 201, a switch 301, and a fixed capacitor 303.

The switch 301 is connected between the first end of the variable capacitor 201 and a first end of the fixed capacitor 303. That is, the switch 301 is in series with the fixed capacitor 303. The switch 301 is controlled by the control input 203. For example, the switch 301 is on (closed) when a voltage that is sufficiently large to turn on the switch 301 is applied to the switch 301 via the control input 203, and the switch is off (open) when 0 volts is applied to the switch 301 via the control input 203. Any voltage that is sufficiently large to turn on the switch 301 may be used.

A second end of the fixed capacitor 303 is connected to the second end of the variable capacitor 201.

The effective capacitance Ceff of the capacitive divider 200 changes from an effective capacitance $C_{eff\_ON}$ when the switch 301 is on (i.e., when Cx is in the circuit of the variable capacitor 201) to an effective capacitance $C_{eff\_OFF}$ when the switch 301 is off (i.e., when Cx is not in the circuit of the variable capacitor 201 because the switch 301 being off causes an open circuit).

The $C_{eff\_OFF}$ of the capacitive divider 200, when the switch 301 is off, is as in Equation (8) as follows:

$$C_{eff\_OFF} = \frac{2C_1C_2}{(C_1 + C_2)} \quad (8)$$

The $C_{eff\_ON}$ of the capacitive divider 200, when the switch 301 is on, is as in Equation (9) as follows:

$$C_{eff\_ON} = \frac{C_x(C_1 + C_2) + 2C_1C_2}{2C_x + (C_1 + C_2)} \quad (9)$$

The change in Ceff of the capacitive divider 200 ($\Delta C_{eff}$), when the switch 301 switches between off and on, is as in Equation (10) as follows:

$$\Delta C_{eff} = \frac{C_x(C_1 - C_2)}{2C_x + (C_1 + C_2)} \quad (10)$$

By reducing the difference in capacitance between $C_1$ and $C_2$, $\Delta C_{eff}$ may be reduced to achieve finer frequency tuning step size.

Figure 3B:
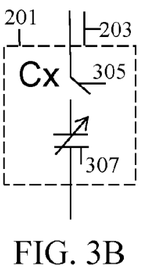

Referring to FIG. 3B, the variable capacitor 201 includes a control input 203 for changing the capacitance of the variable capacitor 201, a switch 305, and a variable capacitor 307.

The switch 305 is connected between the first end of the variable capacitor 201 and a first end of the variable capacitor 307. That is, the switch 305 is in series with the variable capacitor 307. The switch 305 is controlled in the same manner as the switch 301 in FIG. 3A described above.

A second end of the variable capacitor 307 is connected to the second end of the variable capacitor 201.

The capacitance of the variable capacitor 201 is varied in the same manner as in FIG. 3A described above, except that the value of Cx is variable instead of fixed.

Figure 3C:
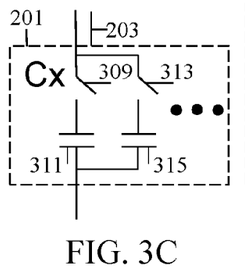

Referring to FIG. 3C, the variable capacitor 201 includes a control input 203 for changing the capacitance of the variable capacitor 201, a predetermined number of switches 309, 313, and a predetermined number of fixed capacitors 311, 315, which implement a variable capacitor. The values of the predetermined number of fixed capacitors 311, 315 can be the same as each other, different from each other, different from each other in a predetermined weighted manner, and so on.

Each of the predetermined number of switches 309, 313 is connected between the first end of the variable capacitor 201 and a first end of one of the predetermined number of fixed capacitors 311, 315, respectively. That is, each of the predetermined number of switches 309, 313 is in series with one of the predetermined number of fixed capacitors 311, 315, respectively. The predetermined number of switches 309, 313 are controlled in the same manner as the switch 301 in FIG. 3A described above.

Second ends of the predetermined number of fixed capacitors 311, 315 are connected to the second end of the variable capacitor 201.

The capacitance of the variable capacitor 201 is varied in the same manner as in FIG. 3A described above, except that the value of Cx is variable instead of fixed.

Figure 3D:
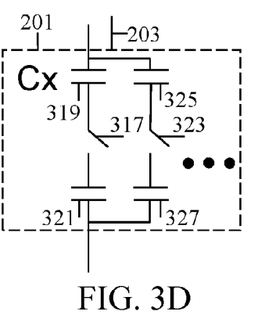
Figure 4A:
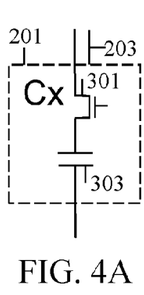
FIGS. 4A-4D are block diagrams of the variable capacitors of FIGS. 3A-3D, respectively, according to embodiments of the present disclosure.
Figure 4B:
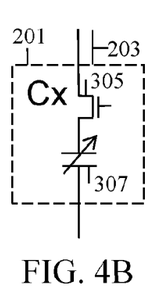
Figure 4C:
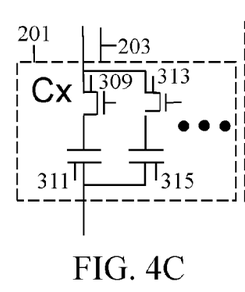
Figure 4D:
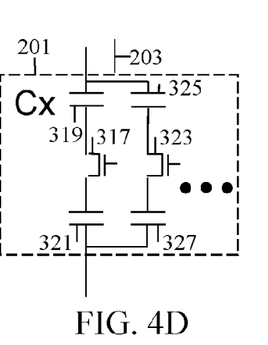

Referring to FIG. 3D, the variable capacitor 201 includes a control input 203 for changing the capacitance of the variable capacitor 201, a predetermined number of switches 317, 323, a predetermined number of first fixed capacitors 319, 325, and a predetermined number of second fixed capacitors 321, 327, which implement a variable capacitor. The values of the predetermined number of first fixed capacitors 319, 325 and the values of the predetermined number of second fixed capacitors 321, 327 can be the same as each other, different from each other, different from each other in a predetermined weighted manner, and so on.

Each of the predetermined number of first fixed capacitors 319, 325 is connected between the first end of the variable capacitor 201 and a first end of one of the predetermined number of switches 317, 323, respectively. Each of the predetermined number of switches 317, 323 is connected between a second end of one of the predetermined number of first fixed capacitors 319, 325 and a first end of one of the predetermined number of second fixed capacitors 321, 327, respectively. That is, each of the predetermined number of switches 317, 323 is in series with one of the predetermined numbers of first fixed capacitors 319, 325, and one of the predetermined numbers of second fixed capacitors, 321, 327, respectively. The predetermined number of switches 317, 323 are controlled in the same manner as the switch 301 in FIG. 3A described above.

Second ends of the predetermined number of second fixed capacitors 321, 327 are connected to the second end of the variable capacitor 201.

The capacitance of the variable capacitor 201 is varied in the same manner as in FIG. 3A described above, except that the value of Cx is variable instead of fixed.

FIGS. 4A-4D are block diagrams of the variable capacitors of FIGS. 3A-3D, respectively, according to embodiments of the present disclosure.

FIGS. 4A-4D are configured, and operate, in the same manner as FIGS. 3A-3D, except that an MOS transistor replaces each of the switches of FIGS. 3A-3D, respectively. The MOS transistor may be a p-channel MOS transistor (PMOS) or an n-channel MOS transistor (NMOS).

FIGS. 5A-5D are block diagrams of the variable capacitor 201 of the capacitive divider 200 of FIG. 2 according to embodiments of the present disclosure.

Figure 5A:
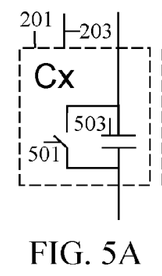
FIGS. 5A-5D are block diagrams of the variable capacitor of the capacitive divider of FIG. 2 according to embodiments of the present disclosure.

Referring to FIG. 5A, the variable capacitor 201 includes a control input 203 for changing the capacitance of the variable capacitor 201, a switch 501, and a fixed capacitor 503.

The switch 501 and the fixed capacitor 503 are each connected between the first end and the second end of the variable capacitor 201. That is, the switch 501 is in parallel with the fixed capacitor 503. The switch 501 is controlled by the control input 203. The switch 501 is controlled in the same manner as the switch 301 in FIG. 3A described above.

The capacitance of the capacitive divider 200 is varied between the Ceff of the capacitive divider 200 when the switch 501 is off (i.e., when Cx is in the circuit of the variable capacitor 201) and the Ceff of the capacitive divider 200 with Cx removed from the variable capacitor 201 when the switch 501 is off (i.e., when Cx is not in the circuit of the variable capacitor 201 because it is short-circuited when the switch 501 is on).

The Ceff of the capacitive divider 200, when the switch 501 is off ($C_{eff\_OFF}$), is as in Equation (11) as follows:

$$C_{eff\_OFF} = \frac{C_x(C_1 + C_2) + 2C_1C_2}{2C_x + (C_1 + C_2)} \quad (11)$$

The Ceff of the capacitive divider 200, when the switch 501 is on ($C_{\text{eff\_ON}}$), is as in Equation (12) as follows:

$$C_{\text{eff\_ON}} = \frac{(C_1 + C_2)}{2} \quad (12)$$

The change in Ceff of the capacitive divider 200, when the switch 501 switches between off and on ($\Delta C_{\text{eff}}$), is as in Equation (13) as follows:

$$\Delta C_{\text{eff}} = \frac{(C_1 - C_2)^2}{2(2C_x + (C_1 + C_2))} \quad (13)$$

Figure 5B:
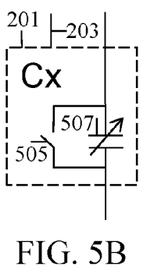

Referring to FIG. 5B, the variable capacitor 201 includes a control input 203 for changing the capacitance of the variable capacitor 201, a switch 505, and a variable capacitor 507.

The switch 505 and the variable capacitor 507 are each connected between the first end and the second end of the variable capacitor 201. That is, the switch 505 is in parallel with the variable capacitor 507. The switch 505 is controlled in the same manner as the switch 301 in FIG. 3A described above.

The capacitance of the variable capacitor 201 is varied in the same manner as in FIG. 5A described above, except that the value of Cx is variable instead of fixed.

Figure 5C:
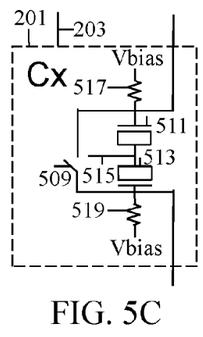

Referring to FIG. 5C, the variable capacitor 201 includes a control input 203 for changing the capacitance of the variable capacitor 201, a switch 509, a first MOS capacitor 511, a second MOS capacitor 513, a first resistor 517, and a second resistor 519, which implement a variable capacitor.

The switch 509 is connected between the first end and the second end of the variable capacitor 201. The first MOS capacitor 511 has a gate connected to the first end of the variable capacitor 201 and its drain and source 515 is connected to the drain and source of the second MOS capacitor 513. The second MOS capacitor 513 has a gate connected to the second end of the variable capacitor 201. The first resistor 517 is connected between the first end of the variable capacitor 201 and a bias voltage Vbias. The second resistor 519 is connected between the second end of the variable capacitor 201 and the bias voltage Vbias. The switch 509 is in parallel with the first MOS capacitor 511 and the second MOS capacitor 513. The switch 509 is controlled in the same manner as the switch 301 in FIG. 3A described above.

The capacitance values of the first MOS capacitor 511 and the second MOS capacitor 513 depend on a voltage applied to the drain and the source 515 of each of the first MOS capacitor 511 and the second MOS capacitor 513.

The capacitance of the variable capacitor 201 is varied in the same manner as in FIG. 5A described above, except that the value of Cx is variable instead of fixed.

Figure 5D:
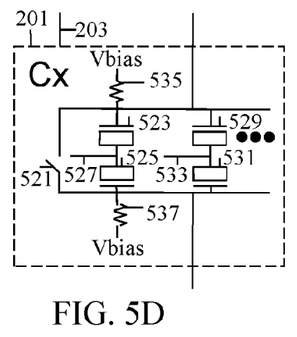
Figure 6A:
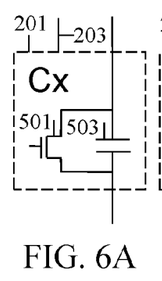
FIGS. 6A-6D are block diagrams of the variable capacitors of FIGS. 5A-5D, respectively, according to embodiments of the present disclosure.
Figure 6B:
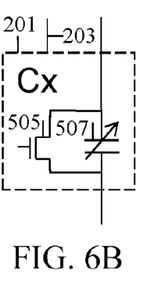
Figure 6C:
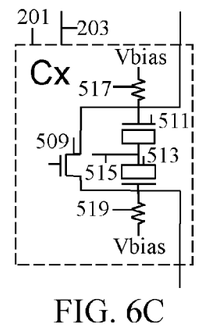
Figure 6D:
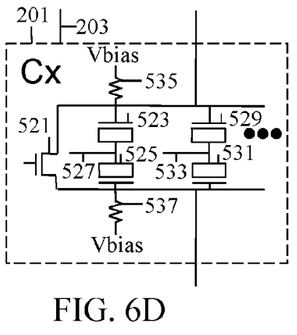

Referring to FIG. 5D, the variable capacitor 201 includes a control input 203 for changing the capacitance of the variable capacitor 201, a switch 521, a first MOS capacitor 523, a second MOS capacitor 525, a third MOS capacitor 529, a fourth MOS capacitor 531, a first resistor 535, and a second resistor 537, which implement a variable capacitor. The variable 201 may include a predetermined number of additional pairs of MOS capacitors.

The switch 521 is connected between the first end and the second end of the variable capacitor 201. The first MOS capacitor 523 has a gate connected to the first end of the variable capacitor 201 and its drain and source 527 is connected to the drain and source of the second MOS capacitor 525. The second MOS capacitor 525 has a gate connected to the second end of the variable capacitor 201. The third MOS capacitor 529 has a gate connected to the first end of the variable capacitor 201 and its drain and source 533 is connected to the drain and source of the fourth MOS capacitor 531. The fourth MOS capacitor 531 has a gate connected to the second end of the variable capacitor 201. The first resistor 535 is connected between the first end of the variable capacitor 201 and a bias voltage Vbias. The second resistor 537 is connected between the second end of the variable capacitor 201 and the bias voltage Vbias. The switch 521 is in parallel with the first MOS capacitor 523, the second MOS capacitor 525, the third MOS capacitor 529, and the fourth MOS capacitor 531. The switch 521 is controlled in the same manner as the switch 301 in FIG. 3A described above.

The capacitance values of the first MOS capacitor 523 and the second MOS capacitor 525 depend on a voltage applied to the drain and the source 527 of each of the first MOS capacitor 523 and the second MOS capacitor 525. The capacitance values of the third MOS capacitor 529 and the fourth MOS capacitor 531 depend on a voltage applied to the drain and the source 533 of each of the third MOS capacitor 529 and the fourth MOS capacitor 531.

The capacitance of the variable capacitor 201 is varied in the same manner as in FIG. 5A described above, except that the value of Cx is variable instead of fixed.

FIGS. 6A-6D are block diagrams of the variable capacitors of FIGS. 5A-5D, respectively, according to embodiments of the present disclosure.

FIGS. 6A-6D are configured, and operate, in the same manner as FIGS. 5A-5D, except that a MOS transistor replaces each of the switches of FIGS. 5A-5D, respectively. The MOS transistor may be a p-channel MOS transistor (PMOS) or an n-channel MOS transistor (NMOS).

Figure 7:
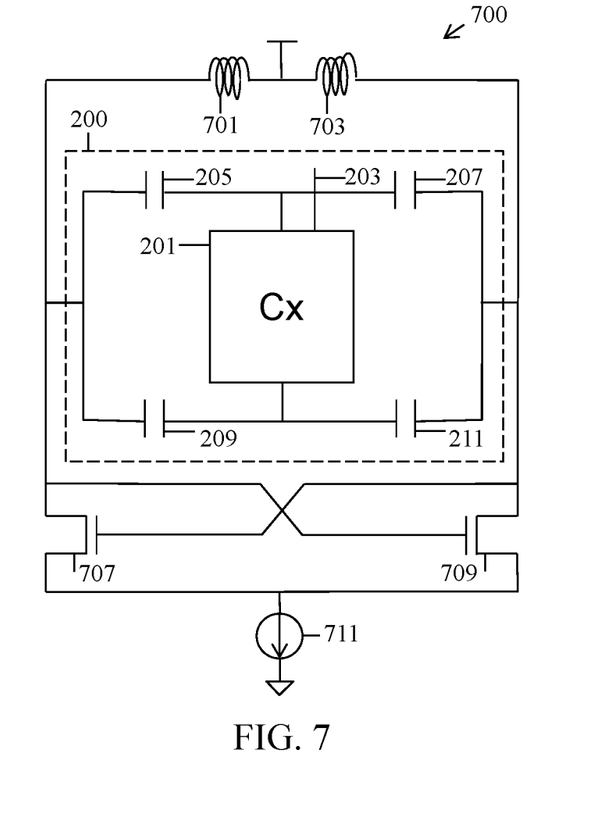
FIG. 7 is a schematic diagram of a DCO that includes a capacitive divider according to an embodiment of the present disclosure.

FIG. 7 is a schematic diagram of a DCO 700 that includes a capacitive divider 200 according to an embodiment of the present disclosure.

Referring to FIG. 7, the DCO 700 includes a first inductor 701, a second inductor 703, the capacitive divider 200, a first NMOS transistor 707, a second NMOS transistor 709, and a current source 711. FIG. 7 includes NMOS transistors. However, the present disclosure is not limited thereto. PMOS transistors may be used, where FIG. 7 is modified accordingly (e.g. swapping the power supply voltage and the ground potential). In addition, both PMOS and NMOS transistors may be used.

The first inductor 701 includes a first end connected to a power supply voltage and a first end of the second inductor 703.

The capacitive divider 200, as described above, includes a first end connected to a second end of the first inductor 701. A second end of the capacitive divider 200 is connected to a second end of the second inductor 703.

The first NMOS transistor 707 includes a drain connected to the first end of the capacitive divider 200 and the first end of the first inductor 701, a gate, and a source.

The second NMOS transistor 709 includes a drain connected to the second end of the capacitive divider 200 and the second end of the second inductor 703, a gate connected to the drain of the first NMOS transistor 707, and a source connected to the source of the first NMOS transistor 707.

The current source 711 includes a first end connected to the sources of the first NMOS transistor 707 and the second NMOS transistor 709, and a second end connected to a ground potential.

The DCO 700 generates a periodic signal, where the frequency of the signal is tuned by a control input to the capacitive divider 200. The first NMOS transistor 707 and the second NMOS transistor 709 are connected in a cross-coupled manner to form a positive feedback loop between the first end and the second end of the capacitive divider 200. The first inductor 701 and the second inductor 703 provide a load to the first NMOS transistor 707 and the second NMOS transistor 709.

Figure 8:
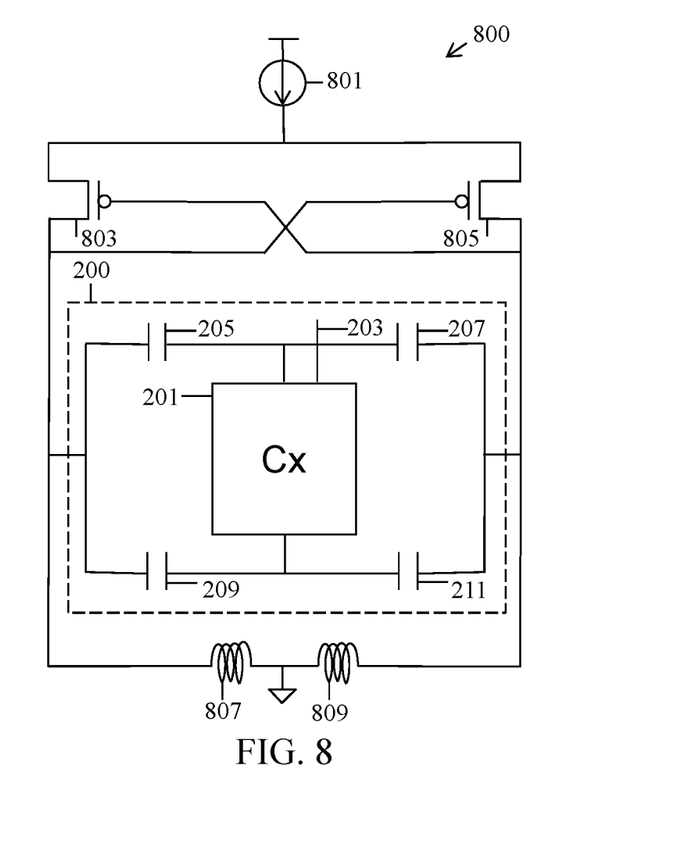
FIG. 8 is a schematic diagram of a DCO that includes a capacitive divider according to an embodiment of the present disclosure.

FIG. 8 is a schematic diagram of a DCO 800 that includes a capacitive divider 200 according to an embodiment of the present disclosure.

Referring to FIG. 8, the DCO 800 includes a current source 801, a first PMOS transistor 803, a second PMOS transistor 805, the capacitive divider 200, a first inductor 807, and a second inductor 809 according to an embodiment of the present disclosure.

The current source 801 includes a first end connected to a power supply voltage and a second end.

The first PMOS transistor 803 includes a source connected to the second end of the current source 801, a gate connected to the second end of the second capacitor 207 of the capacitive divider 200, and a drain connected to the first end of the first capacitor 205 of the capacitive divider 200.

The second PMOS transistor 805 includes a source connected to the second end of the current source 801, a gate connected to the first end of the first capacitor 205 of the capacitive divider 200, and a drain connected to the second end of the second capacitor 207 of the capacitive divider 200.

The first inductor 807 includes a first end connected to the drain of the first PMOS transistor 803 and a second end connected to a ground potential.

The second inductor 809 includes a first end connected to the drain of the second PMOS transistor 805 and a second end connected to the ground potential.

The DCO 800 generates a periodic signal, where the frequency of the signal is tuned by a control input to the capacitive divider 200. The first PMOS transistor 803 and the second PMOS transistor 805 are connected in a cross-coupled manner to form a positive feedback loop between the first end and the second end of the capacitive divider 200. The first inductor 807 and the second inductor 809 provide a load to the first PMOS transistor 803 and the second PMOS transistor 805.

Figure 9:
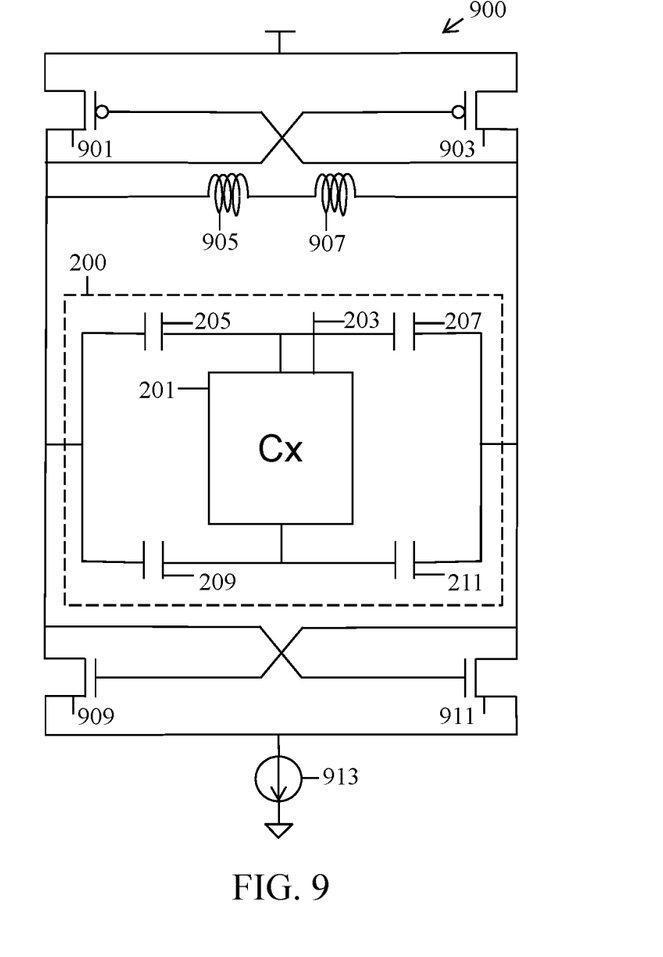
FIG. 9 is a schematic diagram of a DCO that includes a capacitive divider according to an embodiment of the present disclosure.

FIG. 9 is a schematic diagram of a DCO 900 that includes a capacitive divider 200 according to an embodiment of the present disclosure.

Referring to FIG. 9, the DCO 900 includes a first PMOS transistor 901, a second PMOS transistor 903, a first inductor 905, a second inductor 907, the capacitive divider 200, a first NMOS transistor 909, a second NMOS transistor 911, and a current source 913.

The first PMOS transistor 901 includes a source connected to a power supply voltage, a gate connected to the second end of the second capacitor 207 of the capacitive divider 200, and a drain connected to the first end of the first capacitor 205 of the capacitive divider 200.

The second PMOS transistor 903 includes a source connected to the power supply voltage, a gate connected to the first end of the first capacitor 205 of the capacitive divider 200, and a drain connected to the second end of the second capacitor 207 of the capacitive divider 200.

The first inductor 905 includes a first end connected to the drain of the first PMOS transistor 901 and a second end.

The second inductor 907 includes a first end connected to the drain of the second PMOS transistor 903 and a second end connected to the second end of the first inductor 905.

The first NMOS transistor 909 includes a drain connected to the drain of the first PMOS transistor 901, a gate connected to the drain of the second PMOS transistor 903, and a source connected to a first end of the current source 913.

The second NMOS transistor 911 includes a drain connected to the drain of the second PMOS transistor 903, a gate connected to the drain of the first PMOS transistor 901, and a source connected to the first end of the current source 913.

The current source 913 includes a first end connected to the sources of the first NMOS transistor 909 and the second NMOS transistor 911, and a second end connected to a ground potential.

The DCO 900 generates a periodic signal, where the frequency of the signal is tuned by a control input to the capacitive divider 200. The first PMOS transistor 901 and the second PMOS transistor 903 are connected in a cross-coupled manner to form a positive feedback loop between the first end and the second end of the capacitive divider 200. The first NMOS transistor 909 and the second NMOS transistor 911 are also connected in a cross-coupled manner to form a positive feedback loop between the first end and the second end of the capacitive divider 200. The first inductor and 905 and the second inductor 907 provide a load to the first PMOS transistor 901, the second PMOS transistor 903, the first NMOS transistor 909, and the second NMOS transistor 911.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
a first capacitor, including a first end and a second end;
a second capacitor, including a first end connected to the second end of the first capacitor, and a second end;
a variable capacitor, including a first end connected to the second end of the first capacitor, and a second end;
a third capacitor, including a first end connected to the first end of the first capacitor, and a second end connected to the second end of the variable capacitor; and
a fourth capacitor, including a first end connected to the second end of the third capacitor, and a second end connected to the second end of the second capacitor;
a first output connected to the first end of the first capacitor and a second output connected to the second end of the second capacitor, wherein a frequency tuning step is reduced by reducing a difference in capacitance value between the first capacitor and the second capacitor.

2. The apparatus of claim 1, wherein the first capacitor and the fourth capacitor have similar capacitance values, wherein the second capacitor and the third capacitor have similar capacitance values, and wherein the difference in capacitance value between the first capacitor and the second capacitor is based on the frequency tuning step.

3. The apparatus of claim 1, wherein the variable capacitor is comprised of a fifth capacitor including a first end connected to the first end of the variable capacitor, a second end connected to a first end of a switch, wherein a second end of the switch is connected to the second end of the variable capacitor, and wherein the fifth capacitor is one of a fixed capacitor and a second variable capacitor.

4. The apparatus of claim 1, wherein the variable capacitor is comprised of a plurality of fixed capacitors and a plurality of switches, wherein each of the plurality of fixed capacitors includes a first end connected to the first end of the variable capacitor, a second end connected to a first end of one of the plurality of switches, wherein a second end of each of the plurality of switches is connected to the second end of the variable capacitor.

5. The apparatus of claim 1, wherein the variable capacitor is comprised of a fifth capacitor connected between the first end and the second end of the variable capacitor, wherein a switch is connected in parallel with the fifth capacitor, and wherein the fifth capacitor is one of a fixed capacitor and a second variable capacitor.

6. The apparatus of claim 1, wherein the variable capacitor is comprised of a plurality of MOS capacitors having first ends connected in series, a switch connected between the first end and the second end of the variable capacitor and in parallel with the plurality of MOS capacitors, a first resistor connected between a first end of the switch and a bias voltage, and a second resistor connected between a second end of the switch and the bias voltage, wherein capacitances of the plurality of MOS capacitors are controlled by a predetermined input voltage.

7. The apparatus of claim 1, wherein the variable capacitor is comprised of a first plurality of MOS capacitors having first ends connected in series, a second plurality of MOS capacitors having first ends connected in series and connected in parallel with the first plurality of MOS capacitors, a switch connected between the first end and the second end of the variable capacitor and in parallel with the first plurality of MOS capacitors, a first resistor connected between a first end of the switch and a bias voltage, and a second resistor connected between a second end of the switch and the bias voltage, wherein capacitances of the first plurality of MOS capacitors and the second plurality of MOS capacitors are controlled by a predetermined input voltage.

8. The apparatus of claim 1, further comprising:
a first inductor, including a first end connected to a power supply voltage, and a second end connected to the first end of the first capacitor;
a second inductor, including a first end connected to the first end of the first inductor, and a second end connected to the second end of the second capacitor;
a first n-channel metal oxide semiconductor (NMOS) transistor, including a drain connected to the first end of the first capacitor, a gate connected to the second end of the second capacitor, and a source;
a second NMOS transistor, including a drain connected to the second end of the second capacitor, a gate connected to the first end of the first capacitor, and a source connected to the source of the first NMOS transistor; and
a current source, including a first end connected to the source of the first NMOS transistor, and a second end connected to a ground potential.

9. The apparatus of claim 1, further comprising:
a current source, including a first end connected to a power supply voltage, and a second end;
a first p-channel metal oxide semiconductor (PMOS) transistor, including a source connected to the second end of the current source, a gate connected to the second end of the second capacitor, and a drain connected to the first end of the first capacitor;
a second PMOS transistor, including a source connected to the second end of the current source, a gate connected to the drain of the first PMOS transistor, and a drain connected to the gate of the first PMOS transistor;
a first inductor, including a first end connected to the drain of the first PMOS transistor, and a second end connected to a ground potential; and
a second inductor, including a first end connected to the drain of the second PMOS transistor, and a second end connected to the ground potential.

10. The apparatus of claim 1, further comprising:
a first p-channel metal oxide semiconductor (PMOS) transistor, including a source connected to a power supply voltage, a gate connected to the second end of the second capacitor, and a drain connected to the first end of the first capacitor;
a second PMOS transistor, including a source connected to the power supply voltage, a gate connected to the drain of the first PMOS transistor, and a drain connected to the gate of the first PMOS transistor;
a first inductor, including a first end connected to the drain of the first PMOS transistor, and a second end;
a second inductor, including a first end connected to the drain of the second PMOS transistor, and a second end connected to the second end of the first inductor;
a first n-channel metal oxide semiconductor (NMOS) transistor, including a drain connected to the first end of the first capacitor, a gate connected to the second end of the second capacitor, and a source;
a second NMOS transistor, including a drain connected to the second end of the second capacitor, a gate connected to the first end of the first capacitor, and a source connected to the source of the first NMOS transistor; and
a current source, including a first end connected to the source of the first NMOS transistor, and a second end connected to a ground potential.

11. A method of fine capacitance tuning, comprising:
connecting a first end of a first capacitor to a first end of a second capacitor;
connecting a first end of a variable capacitor to the first end of the first capacitor;
connecting a first end of a third capacitor to a second end of the first capacitor;
connecting a second end of the third capacitor to a second end of the variable capacitor;
connecting a first end of a fourth capacitor to the second end of the variable capacitor;
connecting a second end of the fourth capacitor to a second end of the second capacitor; and
reducing a frequency tuning step by reducing a difference in capacitance value between the first capacitor and the second capacitor.

12. The method of claim 11, wherein the first capacitor and the fourth capacitor have similar capacitance values, wherein the second capacitor and the third capacitor have similar capacitance values, and wherein the difference in capacitance value between the first capacitor and the second capacitor is based on the frequency tuning step.

13. The method of claim 11, wherein the variable capacitor is comprised of a fifth capacitor including a first end connected to the first end of the variable capacitor, a second end connected to a first end of a switch, wherein a second end of the switch is connected to the second end of the variable capacitor, and wherein the fifth capacitor is one of a fixed capacitor and a second variable capacitor.

14. The method of claim 11, wherein the variable capacitor is comprised of a plurality of fixed capacitors and a plurality of switches, wherein each of the plurality of fixed capacitors includes a first end connected to the first end of the variable capacitor, a second end connected to a first end of one of the plurality of switches, wherein a second end of each of the plurality of switches is connected to the second end of the variable capacitor.

15. The method of claim 11, wherein the variable capacitor is comprised of a fifth capacitor connected between the first end and the second end of the variable capacitor, wherein a switch is connected in parallel with the fifth capacitor, and wherein the fifth capacitor is one of a fixed capacitor and a second variable capacitor.

16. The method of claim 11, wherein the variable capacitor is comprised of a plurality of MOS capacitors having first ends connected in series, a switch connected between the first end and the second end of the variable capacitor and in parallel with the plurality of MOS capacitors, a first resistor connected between a first end of the switch and a bias voltage, and a second resistor connected between a second end of the switch and the bias voltage, wherein capacitances of the plurality of MOS capacitors are controlled by a predetermined input voltage.

17. The method of claim 11, wherein the variable capacitor is comprised of a first plurality of MOS capacitors having first ends connected in series, a second plurality of MOS capacitors having first ends connected in series and connected in parallel with the first plurality of MOS capacitors, a switch connected between the first end and the second end of the variable capacitor and in parallel with the first plurality of MOS capacitors, a first resistor connected between a first end of the switch and a bias voltage, and a second resistor connected between a second end of the switch and the bias voltage, wherein capacitances of the first plurality of MOS capacitors and the second plurality of MOS capacitors are controlled by a predetermined input voltage.

18. The method of claim 11, further comprising:
connecting a first end of a first inductor to a power supply voltage;
connecting a second end of the first inductor to the second end of the first capacitor;
connecting a first end of a second inductor to the first end of the first inductor;
connecting a second end of the second inductor to the second end of the second capacitor;
connecting a drain of a first n-channel metal oxide semiconductor (NMOS) transistor to the second end of the first capacitor;
connecting a gate of the first NMOS transistor to the second end of the second capacitor;
connecting a drain of a second NMOS transistor to the second end of the second capacitor;
connecting a gate of the second NMOS transistor to the second end of the first capacitor;
connecting a source of the first NMOS transistor to a source of the second NMOS transistor and a first end of a current source; and
connecting a second end of the current source to a ground potential.

19. The method of claim 11, further comprising:
connecting a first end of a current source to a power supply voltage;
connecting a source of a first p-channel metal oxide semiconductor (PMOS) transistor to a second end of the current source;
connecting a gate of the first PMOS transistor to the second end of the second capacitor;
connecting a drain of the first PMOS transistor to the second end of the first capacitor;
connecting a source of a second PMOS transistor to the second end of the current source;
connecting a gate of the second PMOS transistor to the second end of the first capacitor;
connecting a drain of the second PMOS transistor to the second end of the second capacitor; and
connecting a first end of a first inductor to the drain of the first PMOS transistor;
connecting a second end of the first inductor to a ground potential;
connecting a first end of a second inductor to the drain of the second PMOS transistor; and
connecting a second end of the second inductor to the second end of the first inductor.

20. The method of claim 11, further comprising:
connecting a source of a first p-channel metal oxide semiconductor (PMOS) transistor to a power supply voltage;
connecting a gate of the first PMOS transistor to the second end of the second capacitor;
connecting a drain of the first PMOS transistor to the second end of the first capacitor;
connecting a source of a second PMOS transistor to the power supply voltage;
connecting a gate of the second PMOS transistor to the second end of the first capacitor;
connecting a drain of the second PMOS transistor to the second end of the second capacitor; and
connecting a first end of a first inductor to the drain of the first PMOS transistor;
connecting a first end of a second inductor to the drain of the second PMOS transistor;
connecting a second end of the second inductor to the second end of the first inductor;
connecting a drain of a first n-channel metal oxide semiconductor (NMOS) transistor to the second end of the first capacitor;
connecting a gate of the first NMOS transistor to the second end of the second capacitor;
connecting a drain of a second NMOS transistor to the second end of the second capacitor;
connecting a gate of the second NMOS transistor to the second end of the first capacitor;
connecting a source of the first NMOS transistor to a source of the second NMOS transistor and a first end of a current source; and
connecting a second end of the current source to a ground potential.

* * * * *